United States Patent [19]

Sacré

[11] 4,164,695
[45] Aug. 14, 1979

[54] SERVO CONTROLLED TAPE INDICATING DEVICE

[75] Inventor: Louis Sacré, Paris, France

[73] Assignee: Societe D'Electricite Mors, Le Blanc-Mesnil, France

[21] Appl. No.: 781,998

[22] Filed: Mar. 28, 1977

[51] Int. Cl.$^2$ ............................................. G08B 5/00
[52] U.S. Cl. .................................. 318/653; 340/378.5; 324/150
[58] Field of Search .................... 318/653, 687, 135; 340/324 B, 325, 378; 324/144, 150

[56] References Cited

U.S. PATENT DOCUMENTS

| | | | |
|---|---|---|---|
| 3,497,806 | 2/1970 | Nador et al. | 324/150 |
| 3,696,386 | 10/1972 | Gear | 340/378 |
| 4,051,728 | 10/1977 | Metz | 116/129 R |

FOREIGN PATENT DOCUMENTS 2278141 7/1974 France.

*Primary Examiner*—J. V. Truhe
*Assistant Examiner*—M. K. Mutter
*Attorney, Agent, or Firm*—Charles E. Brown

[57] ABSTRACT

A servo controlled strip or tape linear indicating device is described in which a substantially nonresilient and nonself-supporting strip or tape is connected to servo motor means by a single attachment member at a fixed position along the length of the strip or tape. The strip or tape is freely slidable in a guide channel along its entire length and in all positions. The tape is visible with respect to a pointer through at least one transparent portion in the guide channel. The edges of the strip define with the guide channel play sufficient to prevent bunching or buckling of the strip. The servo motor means comprises D'Arsonval type motor having movable coil displaceable in an air gap of a magnetic circuit with fixed pole pieces.

15 Claims, 9 Drawing Figures

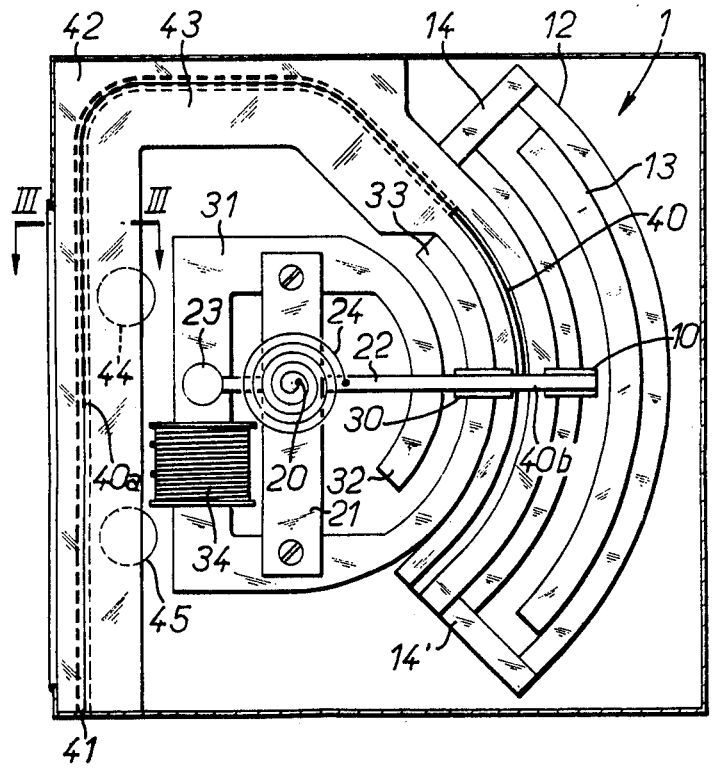
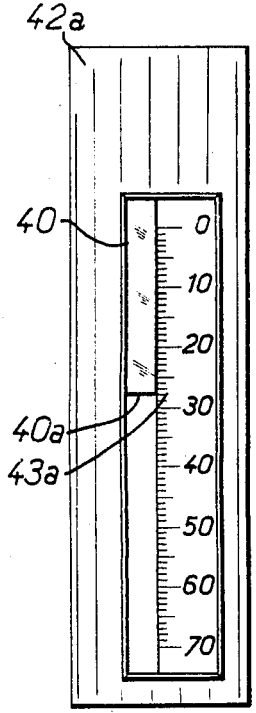
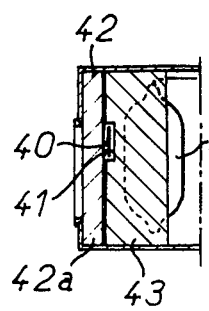
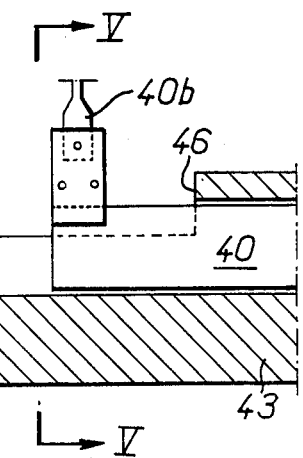
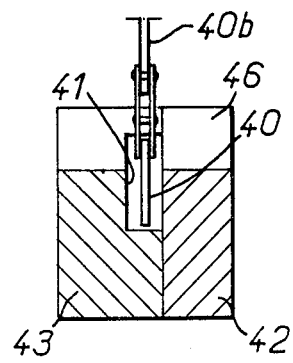

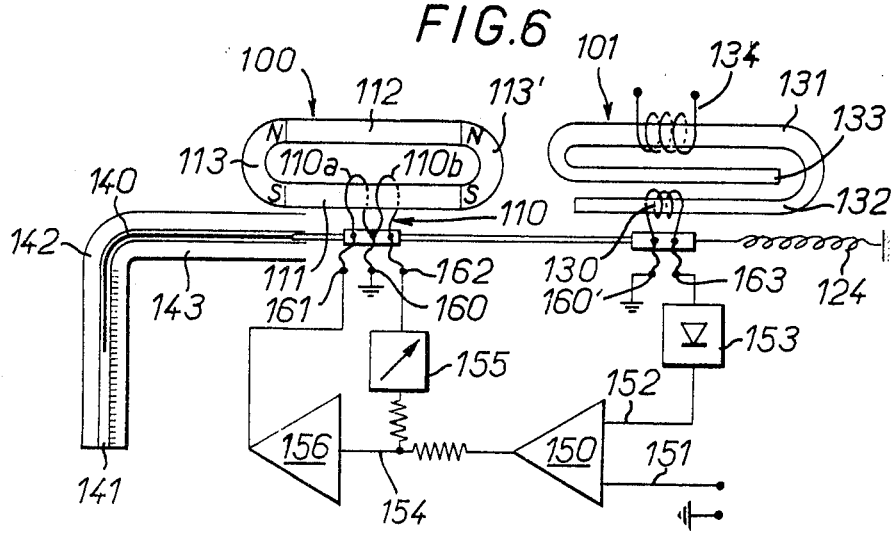
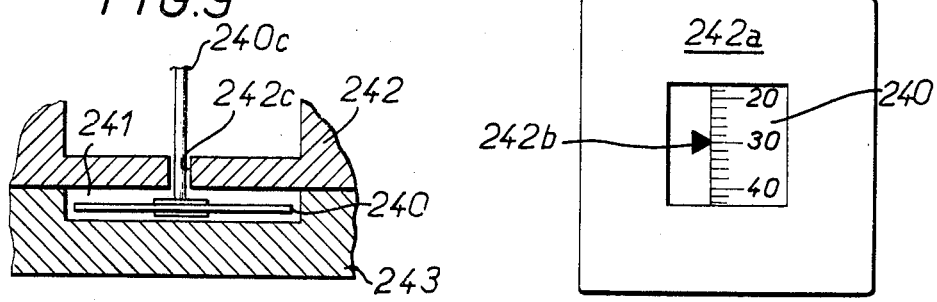
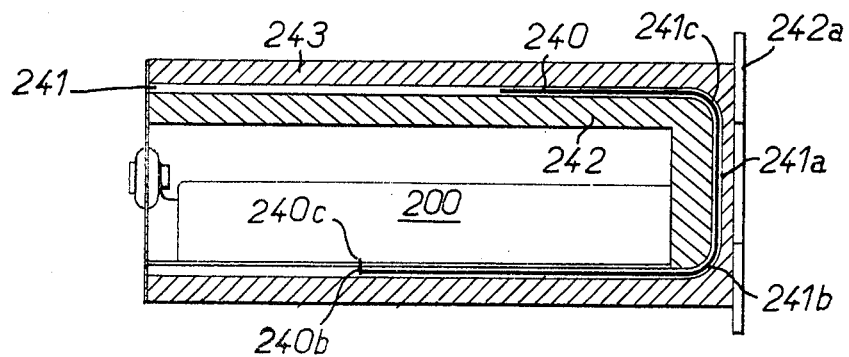

SERVO CONTROLLED TAPE INDICATING DEVICE

FIELD OF THE INVENTION

The present invention relates to servo controlled linear tape indicating device of the type in which a flexible indicator strip is displaceable in front of reference indicia by servo motor means of a servomechanism in response to an error or actuating signal representing the difference between the input signal and the output signal of a position sensor connected to the strip. Indicators of this type are disclosed in U.S. Pat. No. 3,656,451 (Raznov et al.) issued on Apr. 18, 1972 and U.S. Pat. No. 3,696,386 (Gear) issued on Oct. 3, 1972.

BACKGROUND OF THE INVENTION

Linear indicator devices which comprise a flexible indicator strip or tape displaceable relative to reference indicia in a direction perpendicular to the general viewing direction, have the wellknown advantages of good readability, reduced parallax and small frontal space requirement, which make such devices highly suitable for control panels and instrument boards, grouping numerous indicating devices. Their frontal dimensions are especially small where the indicator strip bears the graduated scale which passes in front of a fixed pointer, a small fraction of the scale being frontally viewable, whereas an indicator strip, with a color break defining the pointer, displaceable along a fixed graduated scale provides a peripherally viewable display without requiring the viewer's concentration, on the same.

In classic linear tape indicating devices, the flexible indicator strip or tape is tensioned in a loop and guided by idler rollers or pulleys, a straight portion of the loop between two successive rollers being visible from the front. The loop is generally endless and the tension is produced by resilient means which either are disposed between ends of the strip or bear excentrically against tensioning pulley. Due to the inertia of the guiding pulleys or rollers and the frictional resistance of their pivots, accurate displacement of the flexible strip or tape is not generally obtained directly from the available energy for displacing a signal but necessitates servo control.

Servo control conventionally involves a servo motor for displacing the strip, a position sensor for the strip, comparator means receiving the input signal representing the value to be displayed and an output signal from the position sensor, the comparator means supplying an error or actuating signal to a servo amplifier for the servo motor. Derivative or integrating components are frequently added to the error signal in order to stabilize the servomechanism and improve its response speed.

Mechanical complications and relatively high power requirements are drawbacks to sought-after compactness in linear display tape indicating devices and lead to costs which are often totally out of proportion with their actual advantages.

Indeed, in the U.S. Pat. No. 3,656,451 to Gear an indicator is disclosed having a self-supporting spring stainless steel tape which is wound on a drum passed over an idler pulley and guided in a channel over only part of its length. This arrangement therefore requires two rotatable parts for mounting and guiding the steel tape. But further, owing to the inherent resiliency of the steel tape, it is necessarily spring biased, against its various guiding surfaces thereby increasing frictional losses and increasing power requirements of such an indicator.

SUMMARY OF THE INVENTION

An object of the invention is the provision of servo controlled linear display tape indicating device which has no strip or tape guiding and tensioning means, e.g. drums, pulleys or rollers.

A further object is a servo controlled linear display tape indicating device with a very low power servo motor.

Yet another object of the invention is a servo controlled linear display tape indicating device in which a single carrier mounts both the movable elements of the servo motor and the position sensor.

According to the invention a servo controlled strip or tape linear indicating device is provided comprising a flexible indicator strip or tape disposed adjacent a reference indicia, servo motor means for displacing said indicator strip or tape with respect to said reference indicia in response to an actuating signal which is the difference between an input signal and an output signal from position sensing means associated with and responsive to the position of said strip or tape; wherein the improvement comprises: said servo motor means including a movable coil displaceable in an air gap of a magnetic circuit having fixed pole pieces; attachment means connected to said strip or tape at a single fixed location and to said servo motor means, said strip or tape having at least one free end; and said strip or tape being substantially non resilient and nonself-supporting and freely slidable in and guided along its entire length in all positions thereof by stationary guide channel means having at least a transparent portion for viewing said strip or tape opposite said reference indicia, the edges of said strip or tape defining with said guide channel means lateral play sufficient to prevent bunching or twisting of said strip or tape.

The term "substantially non-resilient" as used herein is intended to define the characteristic of the flexible strip whereby no substantial biasing force is exerted by the strip against the walls of the guide channel due to the inherent resilience. The term "substantially nonself-supporting" is intended to convey the characteristic of the strip disclosed herein, whereby any substantial unsupported length of flexible strip will collapse under its own weight, so as to distinguish it from a metal, e.g. steel strip which is self-supporting.

Contrary to what one might expect, a substantially non-resilient and nonself-supporting flexible strip displaced by attachment means at a single fixed position on the strip with at least one free end, does not have the tendency to bunch, twist or get stuck in the stationary guide channel, on the condition that the lateral play relative to the guide channel is sufficiently small to preclude or eliminate any incipient bunching or twisting action without, however, interfering with the free movement of the flexible strip and on the condition that the flexible strip is effectively guided along its entire length and in all positions. Under these conditions the force required for displacing the strip longitudinally is greatly reduced and may be provided by a D'Arsonval type motor means, comprising a movable coil member and a fixed permanent magnet. In such D'Arsonval type motor means, the moving coil is subjected to the magnetic field, produced by the permanent magnet, in an air gap between fixed pole pieces. The movable coil member is devoid of any ferromagnetic material and is very lightweight, so that the movable assembly including the movable coil member has a very low moment of inertia about its axis of rotation. Because the guide channel has a transparent portion the strip may be viewed through the wall of the guide channel, without interrupting guiding action over the entire length of the strip.

The lateral play is preferably in the order of magnitude of the thickness of the strip and the guide channel which has no radius of curvature, which is not perpendicular to the width of the strip and the curves in the guide channel having radii of curvature which are many orders of magnitude greater than the thickness of the strip. By the term "the same order of magnitude" is meant not greater than a factor of 10, e.g. where the thickness of the strip is 0.1 mm, the lateral play should not exceed 1 mm. Similarly, the radius of curvature should not be less than 100 times the thickness of the tape, or 1 cm in practice. The fact that the radii of curvatures are only perpendicular to the width of the strip means that the strip will not be subjected to helical torsion or twisting.

Preferably the guide channel is made of synthetic plastic material, at least partly transparent, and treated to increase conductivity and thereby reduce surface electrostatic discharges. The guide channel may be molded to have good surface finish and the treatment for reducing electrostatic discharges prevents the strip from adhering to the walls of the channel by electrostatic attraction.

The attachment means may comprise a projection extending perpendicularly to the plane of the strip or protruding laterally from one side of the strip.

According to a preferred embodiment of the indicating device, the pole pieces are elongated in a direction parallel to the path of movement of the movable coil member, i.e., perpendicular to the lines of force in the air gap, the coil member being received on one of said pole pieces. This arrangement insures extended travel of the coil member without skewing components relative to the path of movement.

The movable coil member may be rotatably mounted for arcuate displacements; alternatively the path of displacement of the movable coil member may be rectilinear with parallel guiding.

The movable coil member advantageously carries two windings, a first winding supplied through the servo amplifier and the second winding connected to input of the amplifier through a frequency selecting filter circuit. Thus the servo control may be regulated so as to obtain suitable damping and speed response.

The position sensing means is preferably an inductive position sensor such as described in French Printed Patent Application No. 2,278,141 in name of the assignee of the present application and published on Feb. 6, 1976 and comprises a magnetic circuit alternately energized by a primary winding and divided by a air gap extending between anti-parallel legs, and a movable secondary winding, position sensing coil is movable along one leg, in the air gap. The movable coil member of the servo motor means and the movable secondary winding or position sensing coil form a single movable assembly. The voltage induced in the secondary winding or position sensing coil varies according to the position of the secondary winding along the leg, in strict correspondence with the position of the movable coil member. Comparison between the induced voltage and the magnitude of the input to the indicating device provides an error signal for actuating the movable assembly.

Preferably resilient return means biases the movable coil member towards a rest position and thereby prevents the indicating device, when "off", from giving spurious readings.

Features and advantages of the invention will be brought out in the following description, given by way of example, with reference to the accompanying drawings.

BRIEF DESCRIPTION OF THE DRAWINGS

FIG. 1 shows a side elevational view of an indicating device;

FIG. 2 shows a front elevational view of the indicating device in FIG. 1;

FIG. 3 is a detail, in section, taken on line III—III in FIG. 1;

FIG. 4 shows a detail, viewed from the side, of the attachment means at one end of the indicator strip;

FIG. 5 shows a sectional view taken on the line V—V in FIG. 4;

FIG. 6 shows a circuit diagram for a modified embodiment of the servo controlled indicating device according to the invention;

FIG. 7 is a side view, in section, showing the linear path of a display tape according to an alternative embodiment;

FIG. 8 is a front elevational view of the indicating device of the alternative embodiment of FIG. 7;

FIG. 9 shows a modified attachment means for the indicating device or the embodiment of FIGS. 7 and 8.

DESCRIPTION OF THE PREFERRED EMBODIMENT

According to the preferred embodiment illustrated in FIG. 1, a linear tape indicating device including D'Arsonval motor means which is designated generally by numeral 1, and comprising a movable coil member 10 displaceable along a part circular pole piece 11 which is part of a polarized magnetic circuit including a concentric part circular second pole piece 12, a polarizing permanent magnet 13, also part-circular and radially magnetized, and two magnetic yokes 14, 14' connecting the pole pieces 11 and 12 at their respective ends. The movable coil member 10 is rotatably mounted for angular movement about a pivot 20, as known in the clockwork art, by means of a carrier arm 22 counterbalanced by a counterweight 23. The carrier arm 22 also carries a position sensing coil 30 which is the secondary winding of an inductive sensing means, denoted generally by reference numeral 3, comprising in addition a magnetic circuit 31, energized by a primary winding 34, comprising a ferromagnetic core having two par-circular legs 32 and 33 concentric with the axis of rotation defined by the pivot 20 and extending to each side of an elongated air gap. The coil or winding 30 is wound around the leg 33 of the ferromagnetic core. A set of spiral springs 24 biases the movable assembly, consisting of the position sensing coil or winding 30 and the movable coil member 10 on the carrier arm 22, towards a rest position. The spiral springs 24 are four in number (only one shown) and are used to connect the ends of the coil or winding 30 and of the movable coil member 10 to fixed leads. One of the spiral springs connects a grounded conductor to one end of the position sensing coil or winding 30 and an intermediate tap of the movable coil member 10 and the three other spiral springs are connected to the second end of the coil or winding 30 and the two ends of the movable coil member 10, respectively.

A substantially nonresilient and nonself-supporting flexible strip 40 is fixed at one end to the carrier arm 22 between the coil or winding 30 and the movable coil member 10 and is guided over its entire length between the end 40b and the opposed or second end 40a in the rigid, stationary guide channel 41, whatever the angular position of the arm 22 is. The guide channel 41 is closed off by a body of transparent synthetic plastic material 43 and a complementary body 42 also of synthetic plastic material and is constructed and arranged so that the lateral play between the edges of the strip 40 and the corresponding sidewalls of the guide channel 41 is of the same order of magnitude as the thickness of the strip 40, as defined above. Two lamps 44 and 45 are encased in the body 43. The bodies 42 and 43 are of transparent synthetic plastic material of the methyl methacrylate type and the strip 40 is made of a ribbon of ethyleneglycol polyterephtalate, better known by its trademark MYLAR, 100 microns thick.

The front view of the indicating device in FIG. 2 depicts the body 42 which is partly covered with an opaque lacquer 42a defining in its midst a rectangular viewing window. In the window are a graduated scale 43a marked on the complementary body 43 along the guide channel 41 and the end 40a of the flexible strip 40 which thus defines a movable pointer displaceable along the fixed scale 43a.

In the cross-sectional view of FIG. 3 it can be seen that the guide channel 41 is defined by a depression in the complementary body 43, the body 42 bearing against the complementary body 43 closing off the guide channel 41.

FIGS. 4 and 5 show that the attachment means 40b at one end of the strip 40 comprises lateral projection from one side of strip. A lateral cutout portion 46 in the sidewall of the guide channel 41 in both bodies 42 and 43 permit the connection of the attachment means or tab 40b to the carrier arm 22 of the movable assembly.

The preferred embodiment of the linear tape indicating device essentially shown in FIG. 1 operates as follows:

The flow of direct current through the movable coil member 10 produces a force perpendicular to the general plane of the movable assembly by the interaction of the current in the movable coil member with the magnetic induction flux due to the permanent magnet 13 and channeled by the pole pieces 11 and 12 parallel to the plane of the movable assembly. The movable assembly is urged for angular displacement about the pivot 20 in one of the directions of rotation depending on the direction of the current in the movable coil member. The sensing coil 30 intercepts part of the alternating magnetic induction flux generated by the primary winding 34 in the magnetic circuit 31 of the inductive sensing means 3, the intercepted magnetic flux being a function of the position of the sensing coil 30 along the leg 33 of the ferromagnetic core. In fact the magnetic flux density is substantially constant along the entire air gap between legs 32 and 33, whereby the voltage across the terminals of the sensing coil 30 is a substantially linear function of the angular position of the coil 30 and, therefore, of the movable coil number 10. The spiral springs 24 connect the sensing coil 30 and the movable coil member 10 to the control circuits, as will be explained in detail hereinafter with regard to the FIG. 6. The angular position of the carrier arm 22 of the movable assembly determines the position of the end 40b of the flexible strip or tape 40. The flexible strip 40 slides in the guide channel 41 with very low frictional resistance because the slight lateral play retains the strip 40 substantially flush with the bottom wall of the guide channel 41 whereby the transverse components of force on the strip 40 are virtually nil. It has been ascertained experimentally that a Mylar strip 0.1 mm thick in a guide channel of methyl methacrylate was displaceable in translation without bunching or twisting in response to drive forces less than 10 mN, so that the power loss in linear displacement of the strip at 0.2 meters per second was in the order of 2 mW. In order to avoid electrostatic attraction between the flexible tape 40 and the walls of the guide channel 41, the strip 40 and the transparent bodies 42 and 43 are imparted with improved surface conductivity in the conventional manner. As the flexible strip or tape 40 is kept aligned in the guide channel, the displacements of the end 40a of the strip are strictly identical with the displacements of the other end 40b which is attached to the movable assembly. The spiral springs 24 urge the movable assembly towards its rest position whereby in case of a power cutoff, the movable assembly is returned to its rest position so that the indicating device signals this condition. The return torque exerted by the spiral springs 24 is evidently slightly greater than the torque due to frictional resistance of the strip 40 in the guide channel 41, but is still small compared to the torque capacity of the D'Arsonval type motor means.

The circuit diagram in FIG. 6 comprises a linear electromechanical device 100 and a control circuit 101. The electromechanical device 100 comprises modified D'Arsonval motor means including two pole pieces 111 and 112 and two polarizing magnets 113 and 113', magnetically oriented in the same direction and disposed between the ends of the pole pieces 111 and 112. A movable coil member 110 including coils 110a and 110b is slidably arranged on the pole piece 111. Inductive position sensing means, comprising a magnetic circuit 131 fitted with an energizing primary winding 134 and including a ferromagnetic core having two "antiparallel" legs 132 and 133 defining elongated air gaps, comprises a position sensing coil or winding 130 displaceable along leg 132 and fixed to the movable coil member 110 by a straight, elongated carrier arm for straight line displacement rather than angular displacement of the previous embodiment. The coil member 110, the sensing coil or winding 130 and associated carrier arm, form in combination a movable assembly which pushes and pulls the substantially non-resilient and non-self-supporting strip 140 in the guide channel 141 defined by guide portions 142 and 143. A spring 124 urges the movable assembly to its rest position. The coil member 110 including its coils or windings 110a and 110b connected by flexible leads to the control circuit 101, the flexible leads having a grounded terminal 160 and input leads or terminals 161 and 162. The sensing coil 130 has a grounded terminal 160' and a terminal which is also connected by flexible leads to the control circuit 101. The linear electromechanical device 100 is the linear equivalent of the angularly displaceable electromechanical arrangement shown in FIG. 1 and its operation is in all other ways comparable. The control circuit 101 comprises a comparator or differential amplifier 150 having a first input 151 carrying an external signal representing the displaced value. A second input 152 of the differential amplifier 150 is connected to the output of the rectifier circuit 153 supplied by the voltage at the terminal 163 of the sensing coil 130. The output of the differential amplifier 150 is connected to the input 154 of a servo amplifier 156 whose output is connected to the terminal 161 supplied by the current in the winding 110a of the movable coil member 110. The terminal 162 of the winding 110b is connected to the input of the frequency selecting filter circuit 155 whose output is connected to the input 154 of the servo amplifier 156.

The D.C. voltage supplied by the rectifier 153 to the second input 152 of the differential amplifier 150 results from the magnitude of the A.C. voltage induced in the coil 130 and therefore is an indication of the position of the coil 130 along the leg 132 of the magnetic circuit. The output signal from the differential amplifier 150 is the difference between an input signal at the first input 151 and the voltage at the second input 152 which represents the position of the sensing means. The difference signal is representative of the "error" between the actual position of the movable assembly and the corresponding correct displayed position of the value represented by the signal at the first input 151.

The servo amplifier 156, receiving an error signal at its input 154, supplies actuation current to the primary winding 110a in a direction such that the resultant electromagnetic force displaces the movable assembly in the direction to reduce the deviation or error. The displacements of the movable coil member in the magnetic field between the pole pieces 111 and 112 induces a voltage, which is function of the speed of displacement, in the winding or coil 110b. The induced voltage is applied via the frequency selecting filter circuit 155 in feedback to the input of the servo amplifier 156. By suitably choosing the characteristics of the frequency selecting filter circuit 155 the derivative and integrating components are added to the error signal to regulate, as is conventional in servo systems, the damping and speed response of the servo control. Accordingly, the gain of the servo amplifier 156 may be selected sufficiently high to substantially reduce the deviation of the position of the movable coil member due to the action of the return springs 124; in fact compensation for the return spring force of springs 124 for a given position of the movable coil member requires that the servo amplifier 156 supply a continuous current in response to a small position error signal.

The linear tape indicating device illustrated in the embodiment of FIGS. 7 and 8 comprises a D'Arsonval type motor means and inductive position sensing means similar to the schematic representation in the circuit diagram of FIG. 6; the servo motor and the position sensing means are both housed with the servo control in the case 200. The substantially nonresilient and nonself-supporting strip 240 is pushed or pulled at its end 240b by its attachment means 240c fixed to the movable assembly which is mounted on linear guides (not shown) in a conventional manner. The guide channel 142 comprises a straight line section 241a between two curved sections 241b and 241c whose radii of curvature are several orders of magnitude greater than the thickness of the strip 240. The flexible strip 240 is visible in a transparent frontal viewing window bordered by a translucent or opaque margin 242a facing the straight line section 241 of the guide channel 241. The flexible strip 240 carries a graduated scale and the body 242 carries fixed pointer 242b. This arrangement makes it possible to use long graduated scales having excellent resolution and reduced frontal space requirements. The attachment means connected to the end 240b of the strip 240 is arranged as shown in FIG. 9; the attachment means comprises slender pin or tab riveted to the strip 240 near its center line and perpendicular thereto. The pin or tab 240c protrudes from the channel 241 through a slot 242c along the side wall 242 of the channel 241 and is fixed to the carrier arm of the movable assembly in the case 200. The connection of the pin or tab 240c to the carrier arm is rigid so that the pin or tab remains perpendicular to the strip 240 without tending to bend it or to force it against the walls 242 or 243 of the guide channel 241.

It will be realized that the linear tape indicating devices according to the invention have juxtaposed graduated scale and pointer substantially in the same plane perpendicular to the direction of vision so that parallax is virtually nonexistent without having to fix, with precision, the viewing direction. It is therefore possible to make a very fast and accurate readings. The indicating devices according to the invention are very compact, particularly as to their frontal dimensions, facilitating readability with a rapid glance, and have low power requirements and are thereby particularly suited for a compact grouping in large numbers on a control panels or instrument boards. All the grouped indicators may thus remain in the field of vision of the viewer which facilitates overall monitoring, without one's attention on a certain indicator interfering with one's viewing of the others. The parallax-free reading ease reduces the time necessary for ascertaining a particular reading, during which the viewer's attention is turned away from the indicators as a whole. It will be noted that the arrangement of the graduated scale on the flexible strip further reduces frontal area requirements whereas the arrangement of the graduated scale on the case or body with the free end of the flexible strip defining the pointer for marking the position on the scale is particularly interesting where the displayed value must be constantly visible at least close up.

In view of the foregoing disclosure it will be apparent that the stated objects of the present invention have been achieved.

Although the present invention has been described and illustrated in connection with the preferred embodiments, it is to be understood that modifications and variations may be resorted to without departing from the spirit of the invention as those skilled in the art will readily understand. Such modifications and variations are considered to be within the purview of the present invention as defined by the appended claims.

What is claimed is:

1. A servo controlled strip or tape linear indicating device comprising a flexible indicator strip or tape disposed adjacent a reference indicia, servo motor means for displacing said indicator strip or tape with respect to said reference indicia in response to an actuating signal which is the difference between an input signal and an output signal from position sensing means associated with said strip or tape and responsive to the position of said strip or tape, wherein the improvement comprises:
   (a) said servo motor means including a movable coil displaceable in an air gap of a magnetic circuit having fixed pole pieces;
   (b) attachment means connected to said tape or strip at a single fixed location and to said servo motor means, said tape or strip having at least one free end;

(c) said strip or tape being substantially nonresilient and nonself-supporting and freely slidable in and guided along its entire length in all position thereof by stationary guide channel means of substantially closed cross-section having at least a transparent portion for viewing said strip or tape opposite said reference indicia, the edges of said strip or tape defining with said guide channel means sufficiently small lateral play for preventing bunching or twisting of said strip or tape.

2. An indicating device according to claim 1, wherein the lateral play between the edges of said strip or tape is of the same order of magnitude as the thickness of the tape or strip, all curved portions of said guide channel means having radii of curvature perpendicular to the faces of said strip or tape and several orders of magnitude greater than the thickness of the strip or tape.

3. An indicating device according to claim 1, wherein said guide channel means is formed of plastic material with high surface conductivity to substantially reduce electrostatic forces between the strip or tape and the guide channel means.

4. An indicating device according to claim 1, wherein said attachment means extends generally perpendicular to the plane of said strip or tape.

5. An indicating device according to claim 1, wherein said attachment means extends laterally from said strip or tape.

6. An indicating device according to claim 1, wherein said movable coil member is received on one said pole piece for movement therealong in a direction perpendicular to the lines of force in the air gap between said pole pieces.

7. An indicating device according to claim 6, further comprising a carrier arm rotatably mounted about an axis concentric with said pole pieces which are of part-circular configuration, said arm carrying said movable coil member for angular displacement remote from said axis.

8. An indicating device according to claim 6, wherein said pole pieces are of straight, barlike configuration and said movable coil member is mounted for displacement parallel thereto.

9. An indicating device according to claim 1, further comprising a carrier arm supporting said movable coil member and wherein said position sensing means comprises a position sensing coil member also mounted on said carrier arm for movement therewith and wherein said attachment means is connected to said carrier arm.

10. An indicating device according to claim 1, wherein said coil member comprises a first winding supplied by a servo amplifier and a second winding connected to the input of a frequency selecting filter circuit.

11. An indicating device according to claim 1, wherein said position sensing means comprises a magnetic circuit energized by a primary winding and having parallel legs defining air gaps, the secondary winding defining a position sensing coil displaceable along one of said legs in the corresponding air gap, a carrier arm supporting both said sensing coil and said movable coil member.

12. Indicating device according to claim 1, wherein said strip or tape is formed as a ribbon of ethyleneglycol polyterephtalate having a thickness on the order of 100 microns.

13. Indicating device according to claim 1, wherein said strip or tape is formed as a ribbon of ethyleneglycol polyterephtalate having a thickness on the order of 100 microns, and said guide channel means is formed of synthetic plastic material.

14. Indicating device according to claim 1, wherein said strip or tape is formed as a ribbon of ethyleneglycol polyterephtalate having a thickness on the order of 100 microns and the depth of said guide channel means is on the order of 10 times the thickness of said tape or strip.

15. Indicating device according to claim 1 wherein said channel guide means includes at least two straight portions joined by a curved intermediate portion having a radius extending normal to the width of said strip or tape, said strip or tape is in the form of a ribbon of plastics material having a thickness on the order of 0.1 mm, said channel guide means has a dimension in the thickness direction of said strip or tape on the order of 1 mm, and said radius being on the order of 1 cm.

* * * * *